(12) United States Patent
Bromberger

(10) Patent No.: US 7,541,249 B2
(45) Date of Patent: Jun. 2, 2009

(54) PROCESS FOR PRODUCING A BASE CONNECTION OF A BIPOLAR TRANSISTOR

(75) Inventor: Christoph Bromberger, Heilbronn (DE)

(73) Assignee: Atmel Germany GmbH, Heilbronn (DE)

( * ) Notice: Subject to any disclaimer, the term of this patent is extended or adjusted under 35 U.S.C. 154(b) by 457 days.

(21) Appl. No.: 11/094,285

(22) Filed: Mar. 31, 2005

(65) Prior Publication Data
US 2005/0221570 A1 Oct. 6, 2005

(30) Foreign Application Priority Data
Apr. 1, 2004 (DE) .................. 10 2004 017 166

(51) Int. Cl.
*H01L 21/331* (2006.01)
*H01L 21/8222* (2006.01)
(52) U.S. Cl. .................. 438/321; 438/345; 438/347; 438/349; 438/353; 257/197; 257/572; 257/576; 257/E29.044
(58) Field of Classification Search .................. 438/309, 438/625, 321, 345, 349, 353, 637, 655, 627; 257/576, E21.371, 197, 565, 572, E29.044
See application file for complete search history.

(56) References Cited

U.S. PATENT DOCUMENTS

| | | | |
|---|---|---|---|
| 5,057,888 A * | 10/1991 | Fazan et al. .................. 257/303 |
| 5,093,272 A | 3/1992 | Hoepfner et al. | |
| 5,424,227 A | 6/1995 | Dietrich et al. | |
| 5,587,327 A | 12/1996 | Koenig et al. | |
| 5,731,239 A * | 3/1998 | Wong et al. .................. 438/296 |
| 5,821,149 A | 10/1998 | Schuppen et al. | |
| 6,020,246 A | 2/2000 | Koscielniak et al. | |
| 6,211,044 B1 * | 4/2001 | Xiang et al. ................. 438/585 |
| 6,465,317 B2 * | 10/2002 | Marty .......................... 438/321 |
| 6,720,238 B2 * | 4/2004 | Dietrich et al. ............. 438/458 |
| 6,979,884 B2 * | 12/2005 | Ahlgren et al. ............. 257/588 |

(Continued)

FOREIGN PATENT DOCUMENTS

DE    43 01 333 A1    7/1994

(Continued)

*Primary Examiner*—M. Wilczewski
*Assistant Examiner*—Latanya Crawford
(74) *Attorney, Agent, or Firm*—Muncy, Geissler, Olds & Lowe, PLLC

(57) ABSTRACT

A process for producing a base connection of a bipolar transistor is provided. The process includes the steps of providing a semiconductor structure that can include a three-dimensional sacrificial structure that is selectively removable with respect to adjacent regions. A first semiconductor layer and a second layer of dielectric material is deposited. The first semiconductor layer is partially exposed by partial removal of the second layer. A first reaction layer is deposited that, together with the first semiconductor layer forms reaction products, which are selectively removable with respect to adjacent regions. Remaining material of the first reaction layer that has not reacted with the material of the first semiconductor layer is removed. A second reaction layer is deposited that, with the first semiconductor layer, forms a low-resistivity compound. Remaining material of the second reaction layer that has not reacted with the material of the first semiconductor layer is removed. An additional dielectric layer is deposited and the sacrificial structure is exposed by partial removal of the additional dielectric layer. Dielectric inner spacers are provided in an aperture formed by removal of the sacrificial structure.

16 Claims, 3 Drawing Sheets

U.S. PATENT DOCUMENTS

| | | | |
|---|---|---|---|
| 6,987,052 B2 * | 1/2006 | Baiocchi et al. | 438/343 |
| 2002/0164866 A1 * | 11/2002 | Bae et al. | 438/595 |
| 2002/0197809 A1 * | 12/2002 | Asai et al. | 438/312 |
| 2003/0160198 A1 * | 8/2003 | Wieczorek et al. | 251/100 |
| 2004/0089918 A1 * | 5/2004 | Ohnishi et al. | 257/591 |
| 2004/0099881 A1 | 5/2004 | Franosch et al. | |
| 2005/0121748 A1 * | 6/2005 | Ahlgren et al. | 257/565 |
| 2005/0199908 A1 * | 9/2005 | Geiss et al. | 257/197 |
| 2005/0202669 A1 * | 9/2005 | Bromberger | 438/625 |
| 2005/0221570 A1 * | 10/2005 | Bromberger | 438/309 |

FOREIGN PATENT DOCUMENTS

| | | |
|---|---|---|
| DE | 44 17 916 A1 | 11/1995 |
| DE | 196 09 933 A1 | 9/1997 |
| DE | 199 09 993 A1 | 9/1999 |
| DE | 101 04 776 A1 | 8/2002 |
| EP | 0 436 753 A1 | 7/1991 |

* cited by examiner

PROCESS FOR PRODUCING A BASE CONNECTION OF A BIPOLAR TRANSISTOR

This nonprovisional application claims priority under 35 U.S.C. § 119(a) on German Patent Application No. DE 102004017166.1, which was filed in Germany on Apr. 1, 2004, and which is herein incorporated by reference.

BACKGROUND OF THE INVENTION

1. Field of the Invention

The present invention relates to a process for producing a base connection of a bipolar transistor having active regions of a first conductivity type, active regions of a second conductivity type, and low-resistivity regions of semiconductor/metal mixed crystals that connect to an inner subregion of the active regions of the second conductivity type in an electrically conductive manner.

2. Description of the Background Art

A base of a bipolar transistor manufactured with a planar process can be conceptually divided into an inner base and an outer base. The inner base forms flat, parallel pn junctions with adjacent emitter and collector layers, while the outer base provides electrical connection between the inner base and external contacts. For many applications of bipolar transistors, such as high frequency power amplification, for example, a base resistance is an important parameter, which limits the electrical characteristics of the transistor. The base resistance is frequently dominated by the resistance of the outer base.

In order to reduce the resistance of the outer base of bipolar transistors that are based on silicon technology, the outer base is frequently silicidized. In this process, a layer of a metal that reacts with silicon is deposited on the outer base and made to react with the silicon material of the outer base. By annealing above a transition temperature, the resulting suicides are converted into a modification having a low resistivity.

For many applications, specifically in the high frequency range, it is desirable to introduce an additional semiconductor material, for example germanium or carbon, into the inner base of a bipolar transistor, in addition to silicon. During epitaxial deposition of the semiconductor material for the inner base, the additional semiconductor material is, conventionally, also introduced along with silicon into parts of the outer base. Germanium and carbon have similar chemical properties to silicon, so that a metal that reacts with silicon also reacts with germanium or carbon under the same reaction conditions.

However, compounds of the metal and germanium exhibit poor thermal stability and dissociate at the silicide transition temperature. The germanium and metal deposits formed by dissociation thus exhibit a resistance-increasing effect.

Accordingly, when an additional semiconductor material is present in the inner base, it is desirable to conduct the silicidizing reaction such that the silicidizing front does not penetrate to the depth of the inner base. Conversely, a high silicide thickness is desirable for reducing the base resistance.

To avoid the aforementioned dilemma, where silicidization of a base connection produces decay products that increase resistance, until now a first process and a second process have been known, which are first described briefly and are later explained in detail with reference to FIGS. 1 and 2.

The first process for achieving a high silicide thickness in the outer base of bipolar transistors having silicon and germanium in the inner base while simultaneously stopping the silicidizing front above the layer containing the germanium is known in the conventional art. In the first process, a p-doped layer of a mixed silicon-germanium material and a thick n-doped silicon layer are grown on a collector region of n-doped silicon.

Next, a sacrificial dielectric structure is deposited on the thick silicon layer. Portions of the thick silicon layer are subsequently redoped by implantation into the p-doped outer base, with the sacrificial structure serving as a hard mask. Then titanium is deposited and caused to react with the material of the thick silicon layer. Where the sacrificial structure covers the thick silicon layer during titanium deposition, no silicide formation takes place. After removal of the remaining titanium, an additional dielectric layer is deposited and is exposed through CMP (CMP=chemical mechanical polishing) using the sacrificial structure as a polish stop. The hollow form remaining after removal of the sacrificial structure defines an emitter window that is self-aligning to the outer base and silicide, in which n-doped silicon material of the thick silicon layer is exposed, and that represents the emitter region of the transistor.

The thick silicon layer makes available silicon material for a thick silicide layer without having the silicidizing front penetrate to the depth of the layer of mixed silicon-germanium material. However, the thickness of the silicon layer also produces a large-area diode between the outer base and the emitter region of the transistor so that the resulting component, in addition to having a junction transistor including the emitter region, inner base, and collector region, also has a large-area surface-barrier transistor including the emitter region, outer base, and collector region. While the junction transistor can utilize the advantages resulting from the alloying of germanium with the silicon material of the inner base, this is not the case for the surface-barrier transistor, so the large-area surface-barrier transistor adversely affects the electrical properties of the resulting component.

The second process for achieving a high silicide thickness in the outer base of bipolar transistors having silicon and germanium in the inner base while simultaneously stopping the silicidizing front above the layer containing the germanium is known from the document "IEEE IEDM 2003, Technical Digest, Article 5.3.1," hereinafter referred to as D2.

In the process according to D2, the silicon material required for achieving a high silicide thickness is deposited exclusively above the outer base in through selective epitaxy after completion of the emitter connection, and is subsequently silicidized. The process from D2 makes it possible to significantly reduce the area of the surface-barrier transistor as compared to the process from D1. However, the requirement in the process from D2 for selective epitaxy, a complex and expensive epitaxy process, is a disadvantage. Further disadvantages are described below in connection with the explanation of FIG. 2.

SUMMARY OF THE INVENTION

It is therefore an object of the present invention to provide a manufacturing process for a base connection of a bipolar transistor that produces a layer of low-resistivity material having a high layer thickness on an outer base, which layer of low-resistivity material ends above a depth of an inner base without producing a large-area pn diode between the outer base and an emitter region and without the need for selective epitaxy.

According to an example embodiment of the invention, a process for producing a base connection can include the following steps:

creation of a semiconductor structure, which contains in particular the active regions of a second conductivity type as the base region;

creation on the semiconductor structure of a three-dimensional sacrificial structure that is selectively removable with respect to adjacent regions;

deposition of a first semiconductor layer;

deposition of a second layer of dielectric material;

partial exposure of the first semiconductor layer by partial removal of the second layer, with parts of the first semiconductor layer remaining covered by the remainder of the second layer;

deposition of a first reaction layer of a material that, under suitable reaction conditions, reacts with the material of the first semiconductor layer to form reaction products which are selectively removable with respect to adjacent regions;

creation of suitable reaction conditions for the material of the first reaction layer to react with the material of the first semiconductor layer into first reaction products;

removal of the first reaction products, the remaining material of the first reaction layer that has not reacted with the material of the first semiconductor layer, and the second layer;

deposition of a second reaction layer of material that, under suitable reaction conditions, reacts with the material of the first semiconductor layer to form a low-resistivity compound;

creation of suitable reaction conditions for the material of the second reaction layer to react with the material of the first semiconductor layer into the low-resistivity compound;

removal of the remaining material of the second reaction layer that has not reacted with the material of the first semiconductor layer;

deposition of an additional dielectric layer;

exposure of the sacrificial structure by partial removal of the additional dielectric layer;

selective removal of the sacrificial structure; and introduction of a dielectric inside spacers in a hollow form created by removal of the sacrificial structure.

In a process according to an embodiment of the invention, the semiconductor structure can be covered with the first semiconductor layer and the reaction layer without additional masking steps (i.e., non-selectively), thereby simplifying manufacture. The three-dimensional sacrificial structure, which to some extent can serve as a mask, does not represent an additional mask in this regard, since it can be used multiple times in conjunction with later process steps. Thus, it later defines the extent of a hollow form for a lithography-independent, self-aligning creation of an emitter layer. The use of the three-dimensional structure to cover the inner base during creation of the semiconductor layer that can be later silicidized results in silicide traces that come very close to the inner base, which is advantageous for a low-resistance connection to the inner base. A perfect isolation of the base connection in the vertical direction is achieved by the partial exposure of the first semiconductor layer, the removal of the reaction products in the exposed areas, and the filling of the semiconductor structure above the silicidized layer. Overall, the result is a base connection with a sharply reduced barrier-layer transistor having low resistance and capacitance values.

In the course of further processing of the structure created by the process into a bipolar transistor, the regions made up of the low-resistivity compound can become part of the structures which electrically contact the base of the bipolar transistor. An opening extending between inside spacers will define the position of the emitter window relative to the regions of the low-resistivity compound in a self-aligning manner. The second dielectric layer and the inside spacers can therefore electrically insulate the regions of the low-resistivity compound from the structures that electrically contact the emitter region.

The small-area diode between outer base and emitter region, in particular, is advantageous as compared to the process from D1.

The avoidance of selective epitaxy, in particular, which makes the process more stable and economical in production, is advantageous as compared to the process from D2.

In an example embodiment of the invention, silicon and/or silicon with germanium can be used as the semiconductor material, so that conventional silicon technology can be used to manufacture base connections according to the invention. In this context, the aforementioned advantages are especially pronounced in the manufacture of hetero-bipolar transistors, since the second semiconductor material of the hetero-structure has essentially no opportunity to form undesirable mixed crystals with the reaction layer in the inventive process.

In addition, the inner base can be made of SiGe and other regions can be made of silicon (possibly doped).

In a further example embodiment, a step for creating a semiconductor structure includes steps for creating dielectric regions which delimit the semiconductor material of a first conductivity type, with the dielectric regions being realized as oxide filled shallow trenches (STI shallow trench isolation).

The STI technique makes it possible to achieve greater component densities in comparison with other techniques of dielectric isolation, such as local oxidation on silicon (LOCOS).

In a further embodiment, a, three-dimensional sacrificial structure can be selectively removable with respect to adjacent regions and can be created as a nitride block.

This example embodiment has the advantage that the nitride block can function as a polish stop in a planarizing opening of the semiconductor layer deposited thereon, thereby permitting precise control of the structure height with little effort. Nitride has the additional advantage that it can be removed by an etching step acting selectively on nitride so that a hollow form for self-aligning creation of additional transistor regions, for example, an emitter region, can be created from the nitride block.

Polysilicon can also be nonselectively deposited over the semiconductor structure in a deposition step of the first semiconductor layer.

The nonselective deposition of polysilicon simplifies the manufacturing process quite significantly as compared to deposition performed selectively with the aid of additional masks.

The first reaction layer and/or the second reaction layer can contain titanium. Titanium forms low-resistivity silicides with silicon.

Furthermore, the second layer of dielectric material that covers the first semiconductor layer can be made of oxide and/or nitride.

To this end, the surface of the layer of semiconductor material can be thermally oxidized so that, with silicon as an example of a semiconductor material, a layer of silicon dioxide grows. As yet another alternative or in addition, the layer can contain $Si_3N_4$ and may also possibly contain nonstoichiometric additions of oxygen ("SiON"). An important factor being that the material of the dielectric layer either does not react with the reaction layer to be applied afterward or else reacts with the reaction layer to form second reaction products that are not removed by the material removal that acts selectively on the first reaction products.

Also, in an example embodiment, a TEOS layer can be deposited as the second layer of dielectric material.

Decomposition of tetraethyl orthosilicate (TEOS) at moderate temperatures (up to approximately 700° C.) produces silicon dioxide. During deposition of a TEOS oxide, high-quality oxide films are produced, characterized by high breakdown field strength and conformal edge coverage, for example. Conformal edge coverage has a particular advantage because of a step height of the three-dimensional structure.

The first semiconductor layer can be opened by a planarization step.

As compared to lithographic and etching steps, a planarization step is very economical in process terms. It is especially advantageous that the three-dimensional structure can be used as a polish stop in the planarization step.

The outer base can be covered with a dielectric layer after the formation of the low-resistivity regions and for the resulting surface of the semiconductor structure to be smoothed by an additional planarization step.

As a result of this design, the low-resistivity base connection created with the foregoing steps is buried under a dielectric to a certain extent, resulting in a perfect vertical isolation with respect to the emitter contacts on the surface of the semiconductor structure. As a result of the planarization, the dielectric layer on the three-dimensional structures is opened again, so they can be processed further.

In an alternate embodiment, the hollow form resulting from the removal of the sacrificial structure and the introduction of inside spacers can be replaced by semiconductor material having the first conductivity type.

In this way, a self-aligned emitter layer can be created over the inner base that is exposed after removal of the three-dimensional sacrificial structure, for example.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
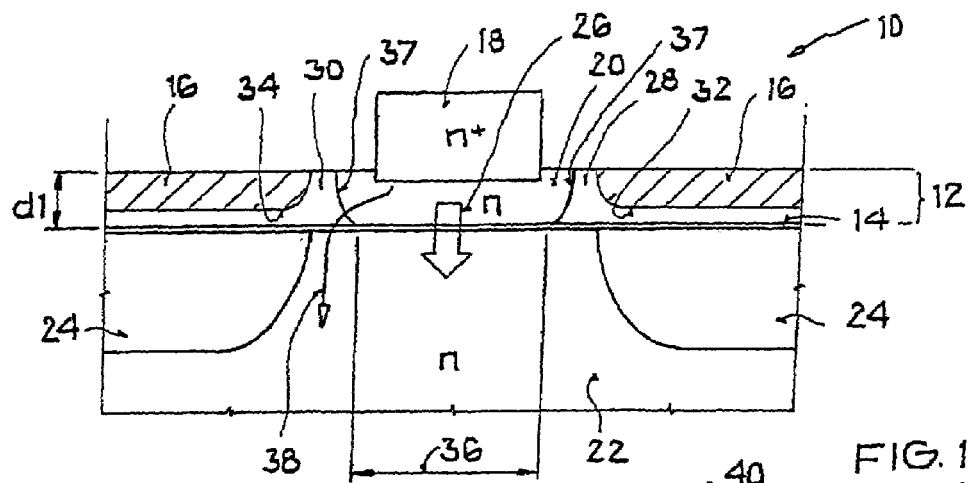
FIG. 1 is a cross-section of a semiconductor structure in an intermediate stage of a conventional first process.

In the drawings, like elements are labeled with like reference symbols.

In FIG. 1, which illustrates a first conventional process as described above, number 10 designates a semiconductor structure with a comparatively thick doped silicon layer 12, e.g., the layer of thickness d1 over a thin SiGe base layer 14. The thickness d1 is dimensioned here such that sufficient material is available for silicidizing the base connection. Hatched regions 16 represent silicidized regions. Block 18 represents a highly n-doped emitter region. The number 20 designates a less highly n-doped emitter region, and the number 22 designates an n-doped collector region with a lateral STI isolation 24. The section of the semiconductor structure 10 shown thus contains a hetero-bipolar transistor (HBT) having emitter regions 18, 20, SiGe base layer 14, and collector region 22. The number 26 represents a regular HBT current flowing in later operation. In such an HBT implementation having a thick silicon layer 12, a connecting implantation of p-dopants is required in the regions 28, 30, which ensure electrical contact between silicide fronts 32, 34 and the active base 36. In operation, the emitter-side edges of this connecting implantation and the emitter layer 20 form a pn-diode with pn-junctions 37, and thus create a large parasitic surface-barrier transistor having an undesirable current 38.

Figure 2:
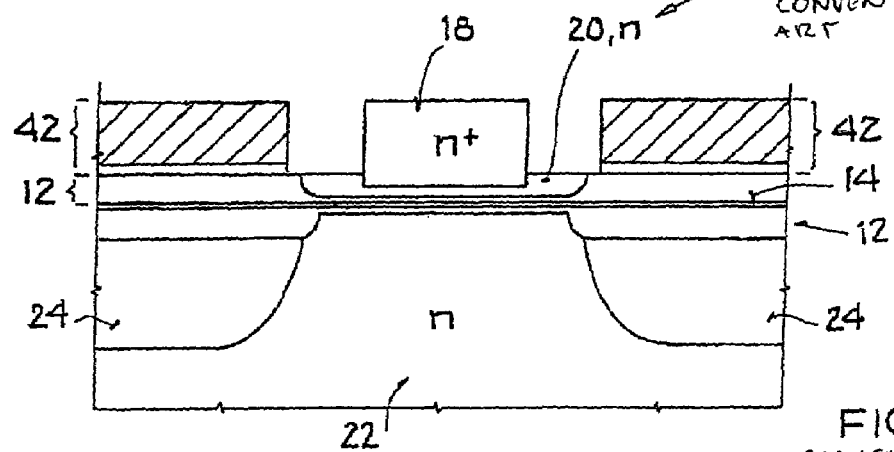
FIG. 2 is a cross-section of a semiconductor structure in an intermediate stage of a conventional second process.

In FIG. 2, which illustrates a second conventional process as described above, number 40 designates a semiconductor structure in which the silicon necessary for silicidizing the base connections has been selectively applied as a thick, structured layer 42 to regions next to the emitter 18. This process also has disadvantages. Aside from the expense associated with selective deposition of polysilicon, the most noteworthy is the requirement that the polysilicon must be deposited exclusively on the base connection regions.

An example embodiment of a production process according to the invention is described below with reference to FIGS. 3 through 9.

Figure 3:
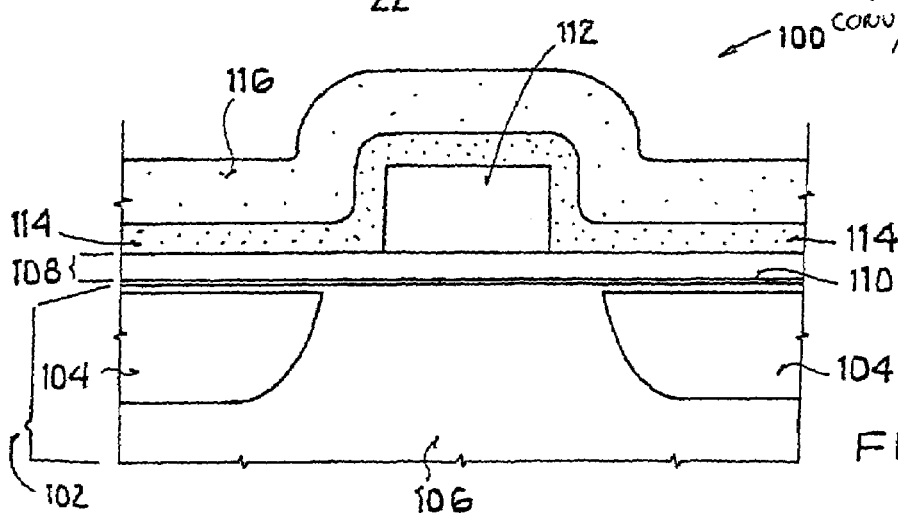
FIG. 3 is a cross-section of a semiconductor structure in a first production stage of an example embodiment of a process according to the invention, having a first layer after nonselective deposition of starting material for base connections and having a dielectric layer.

In FIG. 3, the number 100 designates a semiconductor structure having a substrate layer 102 including dielectric regions 104, which, for example, can be implemented as STI dielectrics and delimit an active region 106 of semiconductor material of a first conductivity type. The substrate layer 102 can have n-doped silicon. A base layer 110 of active semiconductor material having a second conductivity type, for example a thin SiGe layer, can be provided on the surface of the substrate layer 102. The SiGe layer 110 can be covered by additional semiconductor material 108; as a result of later redoping, the central region of the additional material 108 under the block 112 will become an emitter subregion, and the base current will later flow into the outer SiGe base through its outer regions.

The production of a three-dimensional sacrificial structure 112 on the semiconductor material 108 is accomplished by lithography steps, masking steps and etching steps. The three-dimensional sacrificial structure 112 is produced in such a manner that it can later be removed selectively with respect to adjacent regions. This is the case, for example, for nitride blocks surrounded by semiconductor material and oxides, which are likewise labeled below with the number 112 as representatives of the three-dimensional sacrificial structures.

The surface of the semiconductor structure 100, including the nitride blocks 112, can be covered with a first layer 114 of semiconductor material, which is later used to create silicide for base connections. The first layer 114 can be polysilicon, for example, and is created by nonselective deposition from the vapor phase (chemical vapor deposition, CVD). Instead of polysilicon, it is also generally possible for a silicon layer of a morphology not specified in detail (monocrystalline or amorphous) to be deposited. Next, the first layer 114 is covered by a passivating second, dielectric layer 116, which can be formed for example as TEOS oxide. The conformal edge coverage occurring during production of a TEOS oxide is advantageous because of the step height of the nitride blocks 112. As an alternative to formation of a TEOS oxide layer, the surface of the semiconductor layer 114 can also be thermally oxidized so that a dielectric layer 116 of silicon dioxide grows. As yet another alternative or in addition, the reaction-inhibiting, second layer 116 can also be made of $SI_3N_4$ and possibly also contain nonstoichiometric additions of oxygen ("SiON"). An important factor is that the material of the second layer 116 either does not react with the reaction layer to be applied later or else forms second reaction products that are selectively removable with respect to the dielectric layer 116.

Figure 4:
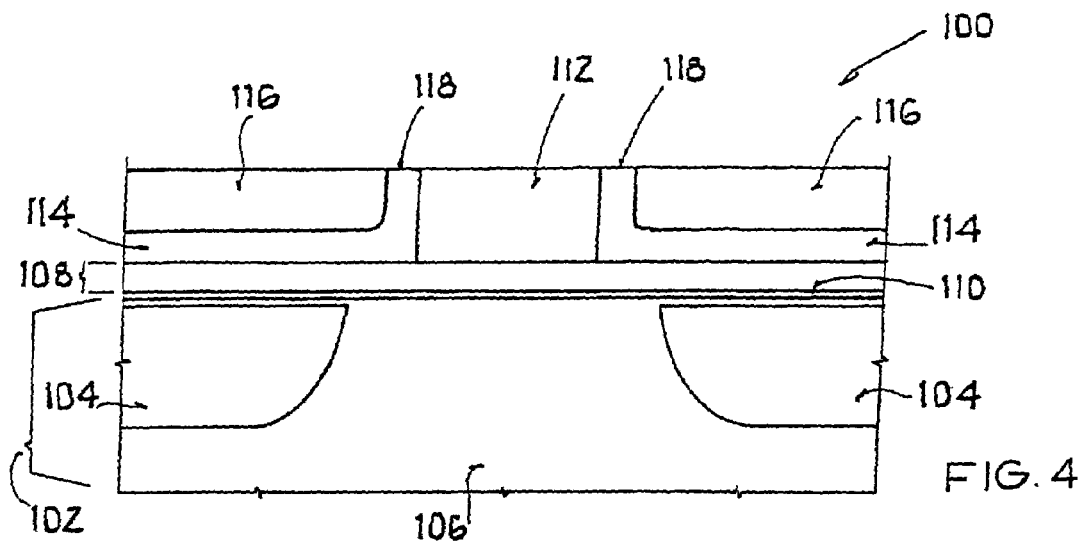
FIG. 4 shows the semiconductor structure from FIG. 3 after an opening planarization step.

FIG. 4 shows the semiconductor structure 100 after further process steps. Subsequent to formation of the passivating, second dielectric layer 116, which can be laterally structured, in other words, opened at individual locations. The structuring can be accomplished with the aid of lithographic masks or otherwise defined masks. As an alternative to a masking step, the opening can also be accomplished in a preferred manner by a planarization step, in which the structure from FIG. 3 is abraded down to the nitride blocks 112, with the nitride blocks 112 serving as polish stop in a CMP step. FIG. 4 shows the semiconductor structure 100 after such a planarization step, in which the first layer 114 of semiconductor material is cut into in the opened regions 118. The opening of the second layer 116 thus preferably is performed so as to expose the three-dimensional sacrificial structure and regions 118 of the first layer 114 of semiconductor material.

Figure 5:
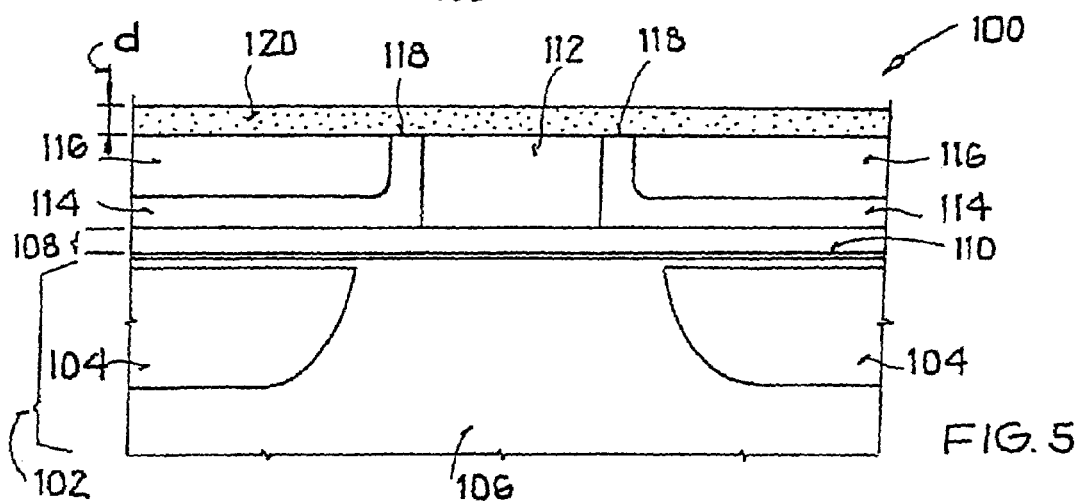
FIG. 5 shows the semiconductor structure from FIG. 4 after production of a first reaction layer.

A first reaction layer 120 is deposited on the opened structure 100 in another step. Under suitable conditions this layer, together with the first layer 114 of semiconductor material to be structured, forms first reaction products that are removed by material removal which acts selectively on the first reaction products. FIG. 5 shows the semiconductor structure 100 after deposition of the first reaction layer 120. In an embodiment where polysilicon is the material of the layer 114 of semiconductor material, the first reaction layer 120 can be made of a transitional metal or a member of the lanthanide group, for example Pt, Ti, Co, Ni, Y or Gd, Dy, Er, Lu, Yb, or of mixtures of such transitional metals and/or lanthanides. Very generally speaking, the first reaction layer 120 can include metals or metal alloys. In conjunction with polysilicon as the material of the first layer 114 of semiconductor material, titanium is considered an especially suitable material for the first reaction layer 120. A thickness d of the first reaction layer 120 determines the quantity of reactive material that lies over the exposed regions 118. Consequently, the thickness d of the layer 120 represents an important parameter for determining the depth of the solid reaction occurring in the vertical direction. Thus, as a consequence of the determination of the thickness d of the layer 120, it is possible to control and adjust the extent of subsequent material removal taking place in the vertical direction.

Outside of the regions 118, the first layer 114 of semiconductor material and the first reaction layer 120 are locally separated from one another by regions of the dielectric layer 116. In these locations, the layer 116 has a passivating, and hence a reaction-inhibiting, effect. As a result, structuring due to solid reactions between the layer 114 and the first reaction layer 120 only occurs in the exposed regions 118 and largely only in the vertical direction.

Subsequent to deposition of the first reaction layer 120, the solid reaction is triggered by setting up suitable reaction conditions. Such conditions can be, for example, rapid thermal annealing (RTA) in a nitrogen atmosphere between 550° C. to 680° C. During this step, in addition to $TiSi_2$, TiN is formed in an orthorhombic face-centered modification on the surface of the titanium layer. The temperature is limited at the lower end by the reaction rate of titanium with silicon, and at the upper end by the undesirable reaction of titanium with $SiO_2$ to form substoichiometric rutile (crystal of titanium and oxygen with fewer than two oxygen atoms per titanium atom). The $SiO_2$ stems from the dielectric layer 116, for example. The formation of substoichiometric rutile is undesirable because substoichiometric rutile does not possess the good insulating properties of $TiO_2$ and can be difficult to remove by wet chemical processes.

Figure 6:
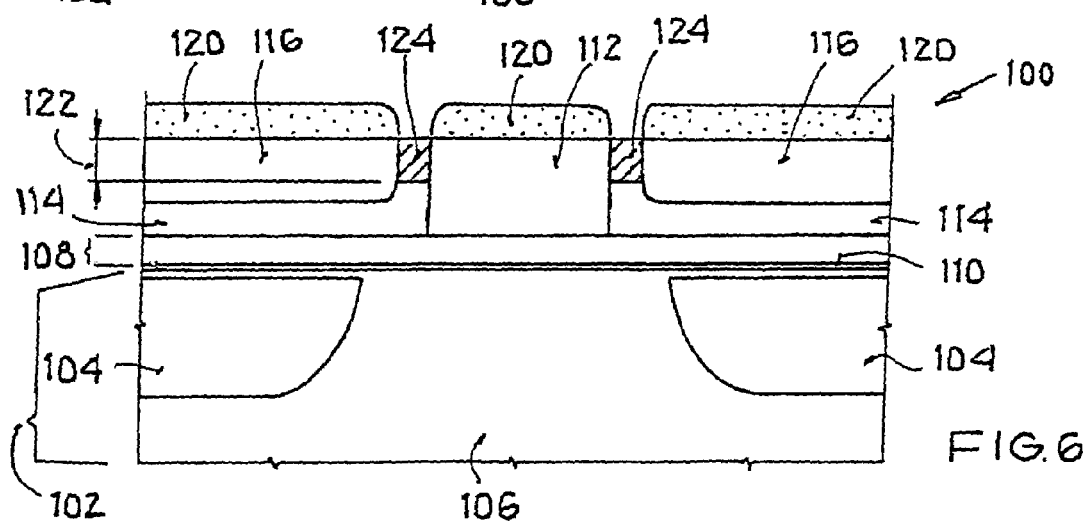
FIG. 6 shows the semiconductor structure from FIG. 5 after a solid reaction.
Figure 7:
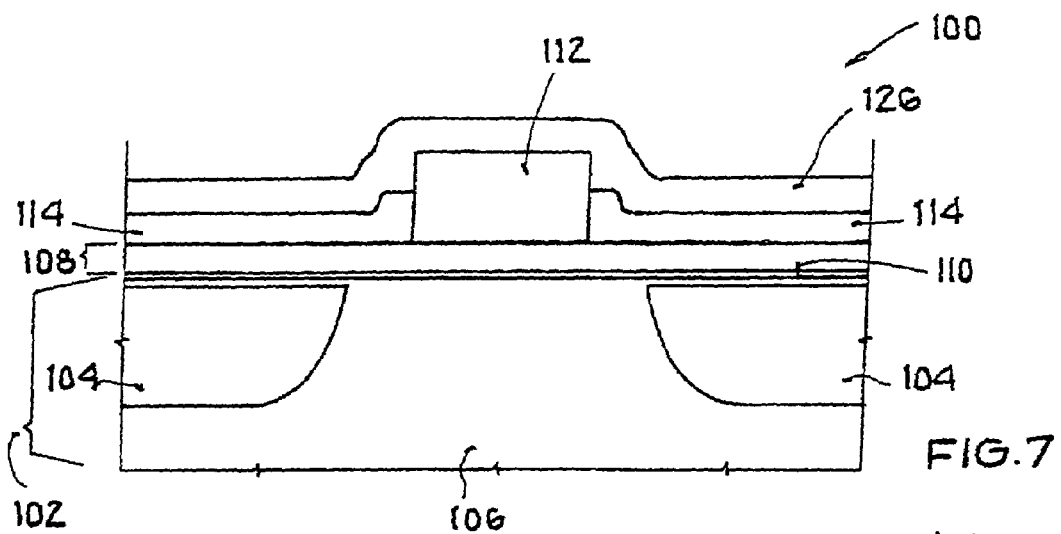
FIG. 7 shows the semiconductor structure from FIG. 6 after the removal of reaction products, remaining material of the first reaction layer that has not reacted, and dielectrics, and the deposition of a second reaction layer.

FIG. 6 shows the semiconductor structure 100 after the conclusion of such a solid reaction, in which parts of the layer 114 and of the first reaction layer 120 have been converted into selectively soluble first reaction products 124 to a defined depth 122 in the layer 114. In the case of polysilicon as the material of the layer 114 and titanium as the material of the reaction layer 120, the first reaction products 124 can be titanium silicide.

Next, there follows the removal, by, for example, a wet chemical etching step, of a TiN layer that may have formed during the RTA step and of the excess titanium from the first reaction layer 120 that did not react with silicon from the first layer 114. This etching step can be accomplished, for example, through the use of an etching agent of $H_2SO_4$ and $H_2O_2$ in a ratio of 2 to 1 or an etching agent of $NH_4OH$, $H_2O_2$ and $H_2O$ in a ratio of 1 to 1 to 5. $H_2SO_4$ and $H_2O_2$ in a ratio of 2 to 1 etches oxide at approximately one tenth the etching rate for titanium, and polysilicon and silicon nitride at approximately one thousandth that rate.

Then the reaction products 124, composed for example of titanium silicide, are removed. This can be accomplished by another wet chemical etching step by means of boiling in concentrated hydrochloric acid, for example. Alternatively, a titanium etching agent of $NH_3$: $H_2O_2$ in a ratio of 1:1 can be used. Hydrochloric acid is excellently selective to oxide, nitride and polysilicon.

After the removal of the first reaction products 124, the remainder of the second dielectric layer 116 can be removed so that the remainder of the first layer 114 of semiconductor material is exposed. The now-exposed parts of the first layer 114 of semiconductor material that still remain are next covered with a second reaction layer 126, shown in FIG. 7, the material of which forms a compound with the semiconductor material of the first layer 114. In the case of polysilicon as the material of the layer 114 of semiconductor material, titanium, for example, can be deposited as the material of the second reaction layer 126 so that an additional RTA step produces intermetallic regions 128, 130 such as those depicted in FIG.

Figure 8:
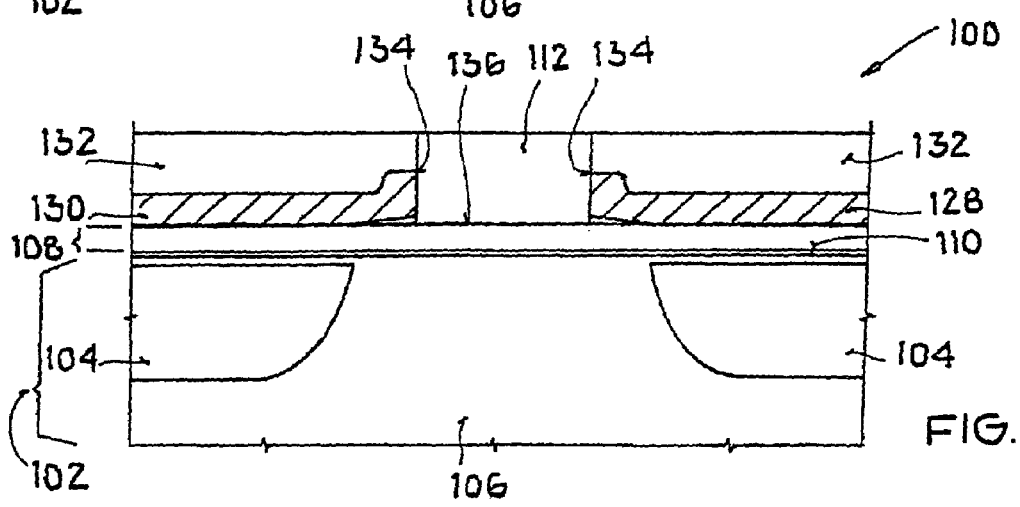
FIG. 8 shows the semiconductor structure from FIG. 7 after a second solid reaction to form base connections, the removal of remaining material of the second reaction layer that has not reacted, and the creation of an additional dielectric layer with a subsequent planarization.

8, which are subsequently converted into low-resistivity regions 128, 130 by annealing. In the pairing of polysilicon and titanium given as an example, the intermetallic regions 128, 130 can be titanium silicide. Subsequent to the formation of the regions 128, 130, the semiconductor structure 100 is coated with an additional dielectric layer 132 and is planarized, in which process the nitride blocks 112 can again serve as polish stop. FIG. 8 shows the semiconductor structure 100 after such a planarization.

Figure 9:
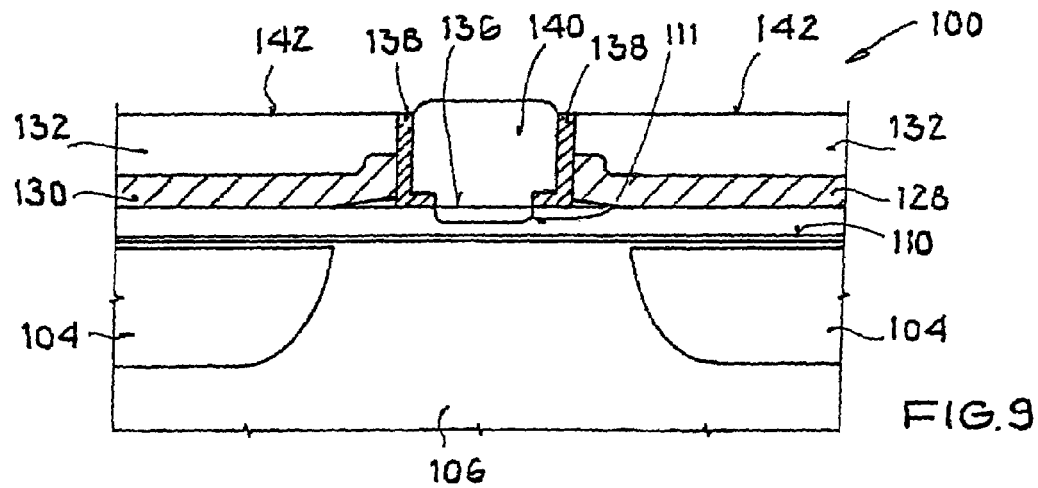
FIG. 9 shows the semiconductor structure from FIG. 8 after possible additional process steps to create an emitter region.

FIG. 9 shows the result of additional process steps. To create a transistor, the nitride blocks 112 are then removed, for example by a selective etching step, and the walls 134 and the bottom 136 of the resulting hollow form are coated with a thin dielectric layer of nitride and/or oxide, with the covering of the bottom 136 being at least partially removed again to produce dielectric inside spacers 138, which preferably have an L-shape, as shown. After the creation of the inside spacers 138, the layer 108 is redoped in a region 111 into a material of the first conductivity type. The region 111 created in this way thus becomes a subregion of an emitter. By filling the hollow form remaining between the dielectric inside spacers 138 with semiconductor material of the first conductivity type, an emitter region 140 is produced which then is contacted from above. The filling of the hollow form can, for example, be accomplished by an epitaxy step in which the at least partially exposed bottom region 136 serves as a seed opening.

Contact to the active region 106, which serves as a collector, can be made from below or from the side, for example. The low-resistivity regions 128, 130 serving as base connections are preferably contacted from above, wherein contact is made by, for example, metallic contacts arranged on the surfaces 142 after a conductive connection has been created between surfaces 142 of the dielectric layer 132 and the low-resistivity base connections 128, 130. The conductive connection is produced, for example, through masking steps, etching steps, filling steps, etc. It is a matter of course that the collector contacts can likewise be made from above, with the collector connections being insulated from the base connections 128, 130 by conventional measures.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for producing a base connection of a bipolar transistor having active regions of a first conductivity type, active regions of a second conductivity type, and low-resistivity regions of semiconductor/metal mixed crystals that connect to an inner subregion of the active regions of the second conductivity type in an electrically conductive manner, the method comprising the steps of:
providing a semiconductor structure, which includes the active regions of a second conductivity type as a base region;
providing, on the semiconductor structure, a three-dimensional sacrificial structure that is selectively removable with respect to adjacent regions;
depositing a first semiconductor layer;
depositing a second layer of dielectric material;
partially exposing the first semiconductor layer by partial removal of the second layer, with parts of the first semiconductor layer remaining covered by the remainder of the second layer;
depositing a first reaction layer that reacts with the first semiconductor layer to form reaction products which are selectively removable with respect to the adjacent regions;
reacting the first reaction layer with the first semiconductor layer to thereby obtain first reaction products;
removing the first reaction products;
removing remaining material of the first reaction layer that was not reacted with the first semiconductor layer;
removing the second layer;
depositing a second reaction layer to react with the first semiconductor layer to form a low-resistivity compound;
reacting the second reaction layer with the first semiconductor layer into the low-resistivity compound;
removing remaining material of the second reaction layer that has not reacted with the first semiconductor layer;
depositing an additional dielectric layer; exposing of sacrificial structure by partially removing the additional dielectric layer;
selectively removing the sacrificial structure; and
introducing dielectric inner spacers in an aperture created by removal of the sacrificial structure.

2. The method according to claim 1, wherein silicon and/or silicon with germanium is the semiconductor material.

3. The method according to claim 2, wherein the active regions of a second conductivity type is a base region that includes SiGe, and wherein active regions of a first conductivity type are made of silicon.

4. The method according to claim 1, wherein dielectric regions which delimit the active regions of a first conductivity type are provided in the semiconductor structure, the dielectric regions being oxide filled shallow trenches.

5. The method according to claim 1, wherein the three-dimensional sacrificial structure that is selectively removable with respect to adjacent regions is a nitride block.

6. The method according to claim 1, wherein the step of depositing of the first semiconductor layer deposits the first semiconductor layer nonselectively over the semiconductor structure and the sacrificial structure, the first semiconductor layer including polysilicon.

7. The method according to claim 1, wherein the first reaction layer and/or the second reaction layer contains titanium.

8. The method according to claim 1, wherein the second, dielectric layer covers the first layer of semiconductor material, and includes oxide and/or nitride.

9. The method according to claim 8, wherein the second layer is a TEOS layer.

10. The method according to claim 1, wherein the first semiconductor layer is partially exposed by a planarization step.

11. The method according to claim 1, further comprising the step of: filling the hollow form, that resulted from the removal of the sacrificial structure, with semiconductor material of the first conductivity type.

12. A method of forming a semiconductor structure, the method comprising the steps of:
providing a substrate layer, a base layer, an additional semiconductor layer, and a removable block, the base layer being provided between the substrate layer, and the additional semiconductor layer, the additional semiconductor layer being provided between the base layer and the removable block;
covering an upper surface of the additional semiconductor layer and an upper surface of the removable block with a first layer of semiconductor material;

covering the first layer of semiconductor material with a dielectric layer;

removing a portion of the dielectric layer to thereby expose a portion of the first layer of semiconductor material in a plane that lies substantially on a plane formed by the upper surface of the removable block;

depositing a first reaction layer over the dielectric layer, the exposed portion of the first layer of semiconductor material, and the upper surface of the removable block, the first reaction layer converting the exposed portion of the first layer of semiconductor material into a first reaction product to a predetermined depth extending from the upper surface of the removable block towards the substrate layer;

removing the first reaction layer;

removing the first reaction product;

removing the dielectric layer to thereby expose an upper surface of the first layer of semiconductor material;

reacting the first layer of semiconductor material with a second reaction layer thereby forming a low resistivity region;

removing a second dielectric layer that is provided on an upper surface of the low resistivity region;

forming an aperture in the low resistivity region by removing the removable block;

forming dielectric spacers on a side wall of the aperture; and filling the aperture with a semiconductor material that has a conductivity that is substantially equal to the substrate layer.

13. The method according to claim 12, wherein the semiconductor structure is a bipolar transistor.

14. The method according to claim 12, wherein the substrate layer and the base layer have different conductivities.

15. The method according to claim 12, wherein the predetermined depth is determined on the basis of a thickness of the first reaction layer.

16. The method according to claim 12, wherein the aperture filled with the semiconductor material is an emitter region, the substrate layer is a collector, and the low resistivity region is a base connection of a transistor.

* * * * *